US006466071B2

(12) United States Patent
Kim et al.

(10) Patent No.: US 6,466,071 B2
(45) Date of Patent: Oct. 15, 2002

(54) METHODS AND CIRCUITS FOR CORRECTING A DUTY-CYCLE OF A SIGNAL

(75) Inventors: Kyu-hyoun Kim; Jung-bae Lee, both of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/826,566

(22) Filed: Apr. 5, 2001

(65) Prior Publication Data

US 2001/0030562 A1 Oct. 18, 2001

(30) Foreign Application Priority Data

Apr. 10, 2000 (KR) .......................... 2000-18672

(51) Int. Cl.[7] .............................. H03K 3/017
(52) U.S. Cl. ................ 327/175; 327/157; 327/161; 327/170; 331/DIG. 2; 375/376
(58) Field of Search .................... 327/172–176, 327/291, 170, 297, 141, 146–150, 153, 155–159, 161, 336, 345, 355, 363, 35–36, 31, 2, 3, 77; 331/1 A, 40, 16, 25, DIG. 2; 375/371, 373–376, 362, 238, 239

(56) References Cited

U.S. PATENT DOCUMENTS 5,406,590 A * 4/1995 Miller et al. ............... 375/376
5,572,158 A * 11/1996 Lee et al. .................. 327/175
5,614,855 A    3/1997 Lee et al. .................. 327/158
6,084,452 A * 7/2000 Drost et al. ................ 327/175

OTHER PUBLICATIONS

Thomad H. Lee et al.; A 2.5 V CMOS Delay–Locked Loop for an 18 Mbit, 500 Megabyte/s DRAM; IEEE Journal of Solid–State Circuits, vol. 29, No. 12; Dec. 1994; pp. 1491–1496.

Bruno W. Garlepp et al.; A Portable Digital DLL for High––Speed CMOS Interface Circuits; IEEE Journal of Solid––State Circuits, vol. 34, No. 5; May 1999; pp. 632–644.

* cited by examiner

Primary Examiner—Timothy P. Callahan
Assistant Examiner—Minh Nguyen
(74) Attorney, Agent, or Firm—Myers Bigel Sibley & Sajovec

(57) ABSTRACT

A signal is duty-cycle corrected by delaying the signal to generate a delayed version of the signal and generating an output signal that transitions from a first state to a second state responsive to a transition of the signal from the first state to the second state and a transition of the delayed version of the signal from the second state to the first state. The output signal transitions from the second state to the first state responsive to a transition of the signal from the second state to the first state and a transition of the delayed version of the signal from the first state to the second state.

30 Claims, 5 Drawing Sheets

METHODS AND CIRCUITS FOR CORRECTING A DUTY-CYCLE OF A SIGNAL

RELATED APPLICATION

This application claims the benefit of Korean Patent Application No. 2000-18672, filed Apr. 10, 2000, the disclosure of which is hereby incorporated herein by reference.

FIELD OF THE INVENTION

The present invention relates to duty-cycle correction, and more particularly to methods and circuits for reducing or preventing duty-cycle error.

BACKGROUND OF THE INVENTION

In digital clock applications, it may be important to precisely control the duty cycle of a clock signal. In general, a clock signal with a 50% duty-cycle is used in digital clock applications of a semiconductor integrated circuit. A duty cycle of 50% means that the high-level and low-level portions of the clock signal are identical. Therefore, a duty-cycle correction circuit may be used in digital clock applications to generate a clock signal having a duty-cycle of approximately 50%. When a clock signal whose duty-cycle is not at 50% is input to the duty-cycle correction circuit, the duty-cycle correction circuit converts the clock signal whose duty-cycle is not at 50% into a clock signal with a duty-cycle of approximately 50%.

Unfortunately, conventional duty-cycle correction circuit may generate duty-cycle distortion (i.e., duty-cycle error). Accordingly, it may be difficult to maintain a duty-cycle of a signal at approximately 50% using conventional circuits. Conventional duty-cycle correction circuits may comprise a slew-rate limiter, a differential amplifier, and an integrator. A representative circuit for duty-cycle correction is disclosed in U.S. Pat. No. 5,945,857 to Havens. When there is offset in the integrator, however, the duty-cycle correction circuit may generate duty-cycle distortion (i.e., duty-cycle error) due to the offset.

SUMMARY OF THE INVENTION

According to embodiments of the present invention, a signal is duty-cycle corrected by delaying the signal to generate a delayed version of the signal and generating an output signal that transitions from a first state to a second state responsive to a transition of the signal from the first state to the second state and a transition of the delayed version of the signal from the second state to the first state. The output signal transitions from the second state to the first state responsive to a transition of the signal from the second state to the first state and a transition of the delayed version of the signal from the first state to the second state. Advantageously, a signal may be duty-cycle corrected without using an integrator circuit, which may introduce duty-cycle error due to offset in the integrator. As a result, improved duty-cycle correction may be obtained.

The delayed version of the signal may be inverted to generate an inverted delayed version of the signal. Moreover, both the signal and the inverted delayed version of the signal may have their slew rates limited so as to generate first and second intermediate output signals, respectively. The output signal may then be generated by determining a voltage difference between the first and second intermediate output signals and generating the output signal responsive to the voltage difference.

The delayed version of the signal may be generated by determining a phase difference between the signal and the delayed version of the signal. A control voltage may be generated in response to the phase difference and the delayed version of the signal may be generated in response to the control voltage. The signal may be delayed for a predetermined time to generate the delayed version of the signal. In accordance with particular embodiments, the predetermined time may correspond to the time in which the signal is in the first state during a single cycle of the signal or a time in which the signal is in the second state during a single cycle of the signal.

In accordance with further embodiments of the present invention, a signal is duty-cycle corrected by limiting a slew rate of the signal to generate a first intermediate output signal. A voltage difference is determined between the first intermediate output signal and a reference voltage and an output signal is generated responsive to the voltage difference. The output signal is delayed to generate a delayed version of the output signal and the reference voltage is generated in response to the output signal and the delayed version of the output signal.

The delayed version of the output signal may be generated by determining a phase difference between the output signal and the delayed version of the output signal. A control voltage may be generated in response to the phase difference and the delayed version of the output signal may be generated in response to the control voltage. Furthermore, the reference voltage may be generated in response to a phase difference that is determined between the output signal and the delayed version of the output signal.

While the present invention has been described above primarily with respect to method aspects of the invention, it will be understood that the present invention may be embodied as methods and/or circuits.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
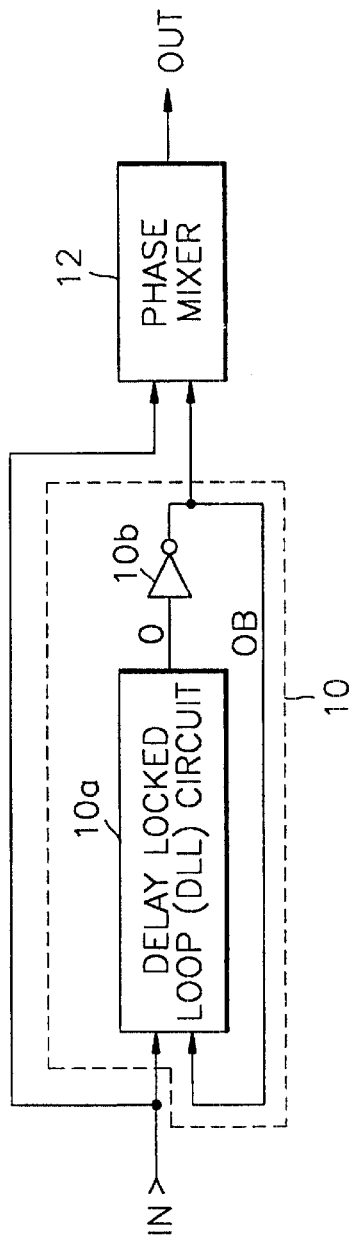
FIG. 1 is a block diagram that illustrates duty-cycle correction circuits in accordance with embodiments of the present invention.

While the invention is susceptible to various modifications and alternative. forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 is a block diagram that illustrates duty-cycle correction circuits in accordance with embodiments of the present invention. Referring now to FIG. 1, an exemplary circuit for duty-cycle correction comprises an inverting delay circuit 10 and a phase mixer circuit 12. The inverting delay circuit 10 receives an input signal IN and outputs an output signal OB by inverting and delaying the received input signal IN for a predetermined time. The phase mixer circuit 12 generates an output signal OUT of which the duty cycle is corrected by mixing the phase of the input signal IN with the phase of the output signal OB of the inverting delay circuit 10. More specifically, the phase mixer circuit 12 generates the output signal OUT, which rises approximately midway between the rising edge of the input signal IN and the rising edge of the output signal OB of the inverting delay circuit 10, and falls approximately midway between the falling edge of the input signal IN and the falling edge of the output signal OB of the inverting delay circuit 10 responsive to the input signal IN and the output signal OB of the inverting delay circuit 10.

The inverting delay circuit 10 comprises a delay circuit 10a, which delays the input signal IN for a predetermined time, and an inverting circuit 10b, which inverts the delayed signal (i.e., the output signal O of the delay circuit 10a). The delay circuit 10a may comprise a general delaying device or a delay locked loop (DLL) circuit. The delay circuit 10a preferably comprises a delay locked loop (DLL) circuit when the input signal IN has a high frequency. When the delay circuit 10a comprises a DLL circuit, the delay circuit 10a delays the input signal IN for a predetermined time in response to the output signal OB of the inverting circuit 10b. In other words, the delay circuit 10a, which comprises a DLL circuit, delays the input signal IN for a predetermined time by comparing the phase of the output signal OB of the inverting circuit 10b with the phase of the input signal IN and responding to the comparative result. The predetermined time may be an arbitrary time, but to more precisely correct the duty-cycle of the input signal IN, the predetermined time preferably corresponds to the low level or high level interval of the input signal IN.

Figure 2:
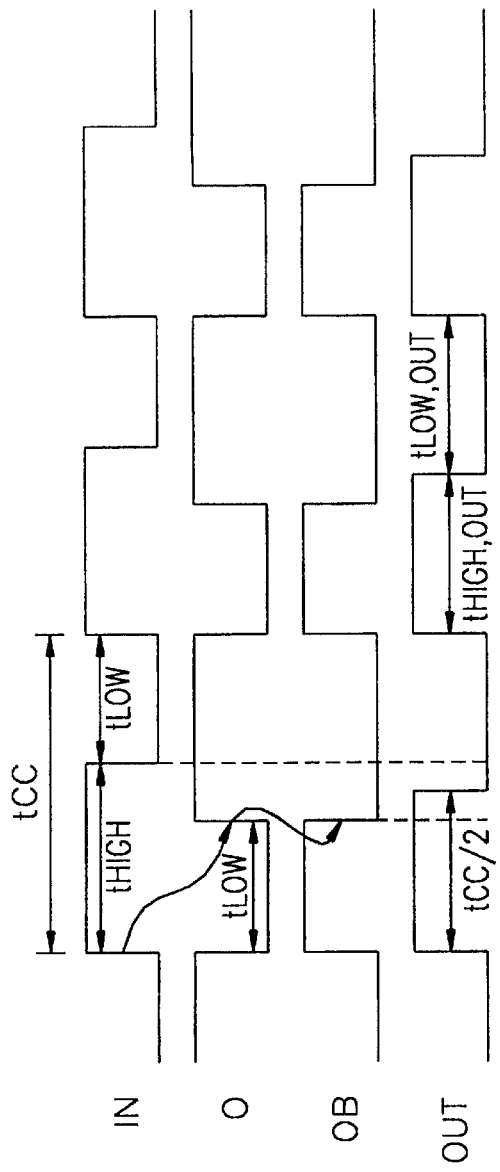
FIG. 2 is a signal timing diagram of signals that illustrate operations of duty-cycle correction circuits in accordance with embodiments of the present invention.

FIG. 2 is a signal timing diagram of signals that illustrate operations of duty-cycle correction circuits in accordance with embodiments of the present invention. The timing diagram shown in FIG. 2 is based on an exemplary embodiment in which the delay circuit 10a comprises a DLL circuit and the delay applied by the delay circuit 10a corresponds to the low interval of the input signal IN. When an input signal IN, which has a duty-cycle that is not equal to 50%, is input to the DLL circuit, the DLL circuit compares the phase of the input signal IN with the phase of a feedback signal (i.e., the phase of the output signal OB of the inverting circuit 10b) and variably delays the input signal IN responsive to the comparative result. In other words, the DLL circuit variably delays the input signal IN until the DLL circuit is locked, that is, until the rising edge of the input signal IN and the rising edge of the output signal OB of the inverting circuit 10b occur at substantially the same time.

When the DLL circuit is locked, the output signal O, which is delayed as much as time tLOW corresponding to the low level interval of the input signal IN, is continuously generated from the DLL circuit. Accordingly, the output signal OB, which has a phase opposite to that of the output signal O of the DLL circuit, is continuously generated from the inverting circuit 10b. That is, the rising edge of the output signal OB of the inverting circuit 10b and the rising edge of the input signal IN occur at substantially the same time, and the output signal OB, which is inverted and delayed by as much as the time tLOW from the input signal IN, is generated from the inverting circuit 10b. The output signal OB of the inverting circuit 10b is supplied to the phase mixer 12.

Subsequently, the output signal OUT, which has a corrected duty-cycle, is generated by the phase mixer circuit 12 by mixing the phase of the input signal IN with the phase of the output signal OB. The output signal OUT rises approximately midway between the rising edge of the input signal IN and the rising edge of the output signal OB due to operation of the phase mixer circuit 12 (as shown in FIG. 2, the rising edge of the input signal IN and the rising edge of the signal OB occur at approximately the same time) and falls approximately midway between the falling edge of the input signal IN and the falling edge of the signal OB.

Accordingly, the high interval tHIGH, OUT and the low interval tLOW, OUT of the output signal OUT of the phase mixer circuit 12 can be expressed as follows:

$$tHIGH, OUT = (tHIGH, IN + tHIGH, OB)/2 \quad (1)$$

$$tLOW, OUT = (tLOW, IN + tLOW, OB)/2 \quad (2)$$

In Equations 1 and 2, tHIGH, IN and tLOW, IN represent the high level and low level intervals of the input signal IN, respectively, and tHIGH, OB and tLOW, OB represent the high and the low intervals of the output signal OB of the inverting circuit 10b, respectively.

Meanwhile, because tHIGH, OB of the signal OB is identical to the low level interval tLOW, IN of the input signal IN, and tLOW, OB of the signal OB is identical to the high level interval tHIGH, IN of the input signal IN, Equations 1 and 2 can be expressed as follows:

$$tHIGH, OUT = (tHIGH, IN + tLOW, IN)/2 = tCC/2 \quad (3)$$

$$tLOW, OUT = (tLOW, IN + tHIGH, IN)/2 = tCC/2 \quad (4)$$

In Equations 3 and 4, tCC represents the period of the input signal IN. Accordingly, the duty-cycle of the output signal OUT of the phase mixer circuit 12 may be approximately 50%.

Exemplary operations of duty-cycle correction circuits have been described by way of example in which the delay time of the DLL circuit corresponds to the low level interval tLOW of the input signal IN. It will be understood, however, that, in accordance with further embodiments of the present invention, any delay time may be used, including a delay time that corresponds to the high level interval tHIGH of the input signal IN. Moreover, a compensating delaying device may be interposed between the output terminal of the inverting circuit 10b and the input terminal of the DLL circuit in accordance with further embodiments of the present invention.

An integrator circuit need not be used in duty-cycle correction circuits in accordance with embodiments of the present invention illustrated in FIG. 1. Advantageously, by avoiding the use of an integrator circuit, duty-cycle correction circuits need not account for duty-cycle errors resulting from integrator offset.

Figure 3:
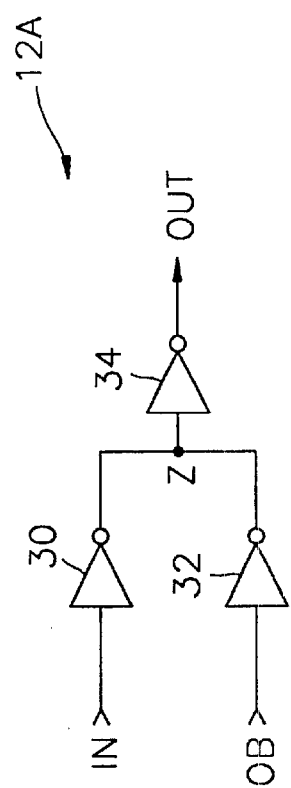
FIG. 3 is a schematic that illustrates mixer circuits in accordance with embodiments of the present invention.
Figure 4:
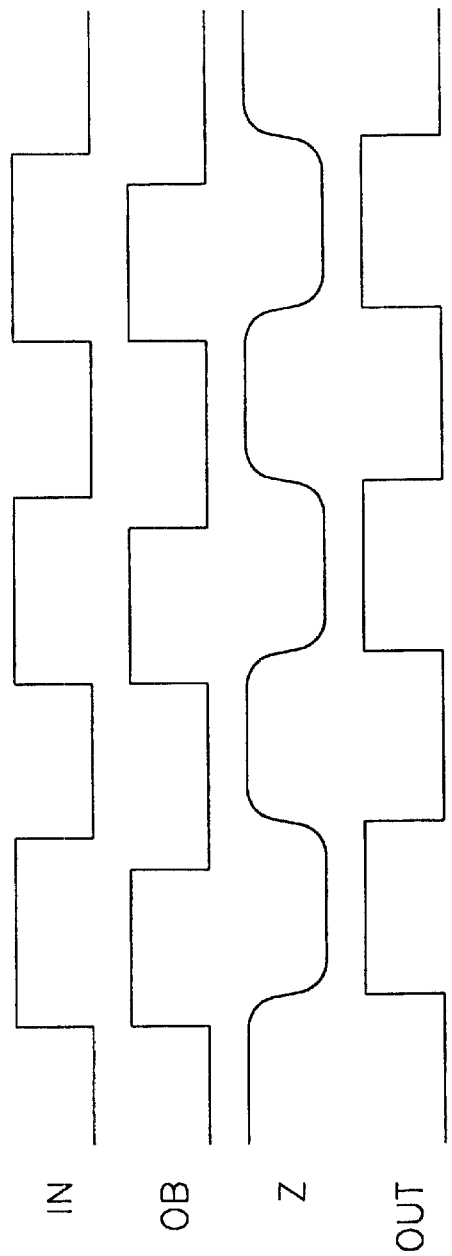
FIG. 4 is a signal timing diagram of signals that illustrate operations of mixer circuits in accordance with embodiments of the present invention.

FIG. 3 is a schematic that illustrates mixer circuits in accordance with embodiments of the present invention and FIG. 4 is a signal timing diagram of signals that illustrate operations of mixer circuits in accordance with embodiments of the present invention. In FIGS. 3 and 4, the signal IN corresponds to the input signal IN shown in FIG. 1, and the signal OB corresponds to the output signal OB of the inverting delay circuit 10 shown in FIG. 1. The signal OUT corresponds to the output signal OUT shown in FIG. 1.

Referring now to FIG. 3, a phase mixer circuit 12A comprises inverting circuits 30 and 32, each having an output terminal commonly connected to a node Z, and an inverting circuit 34, which has an input terminal connected to the node Z. The signal IN is received through the input terminal of the inverting circuit 30, the signal OB is received through the input terminal of the inverting circuit 32, and the signal OUT, in which the phases of two signals are mixed, is output from the output terminal of the inverting circuit 34. That is, assuming that the inverting circuits 30, 32, and 34 introduce no delay, the signal OUT, which rises approximately midway between the rising edge of the signal IN and the rising edge of the signal OB and falls approximately midway between the falling edge of the signal IN and the falling edge of the signal OB, is output from the output terminal of the inverting circuit 34. As shown in FIG. 4, however, the signal OUT is output from the output terminal of the inverting circuit 34 after the signal OUT is delayed by the inverting circuits 30, 32, and 34.

Figure 5:
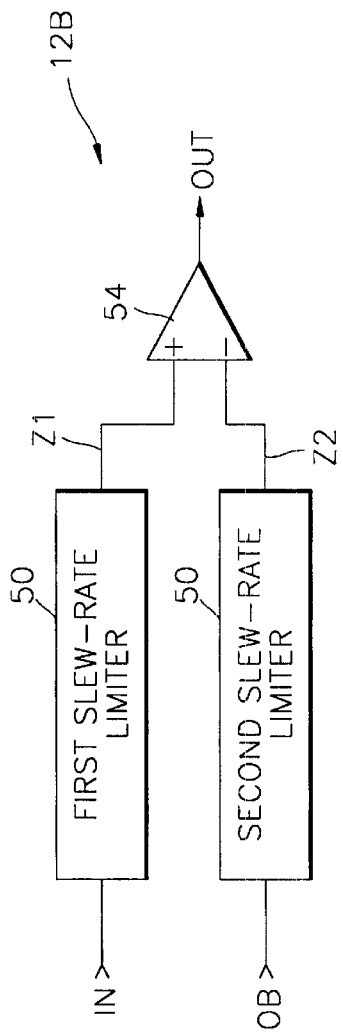
FIG. 5 is a block diagram that illustrates mixer circuits in accordance with further embodiments of the present invention.
Figure 6:
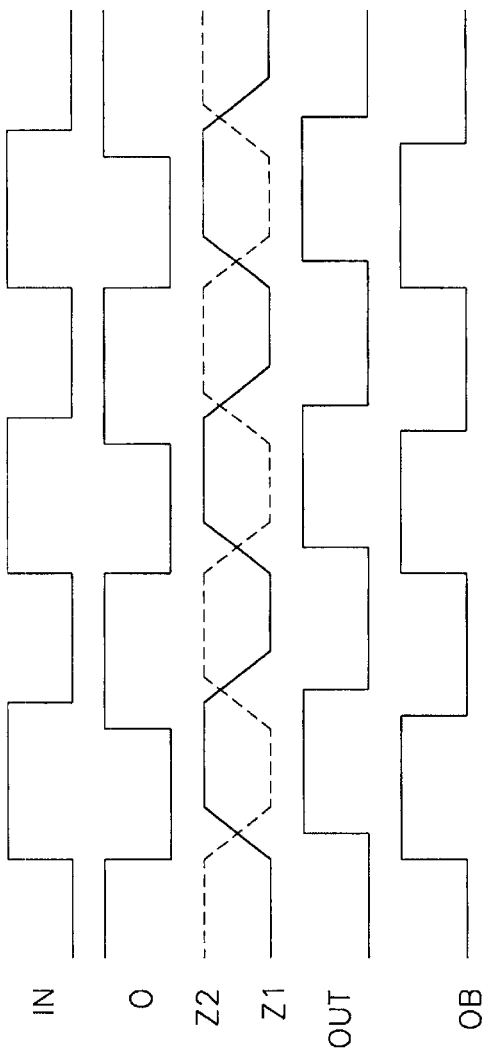
FIG. 6 is a signal timing diagram of signals that illustrate operations of mixer circuits in accordance with further embodiments of the present invention.

FIG. 5 is a schematic that illustrates mixer circuits in accordance with further embodiments of the present invention and FIG. 6 is a signal timing diagram of signals that illustrate operations of mixer circuits in accordance with further embodiments of the present invention. In FIGS. 5 and 6, the signal IN corresponds to the input signal IN shown in FIG. 1, and the signal OB corresponds to the output signal OB of the inverting delay circuit 10 shown in FIG. 1. The signal OUT corresponds to the output signal OUT shown in FIG. 1.

Referring now to FIG. 5, a phase mixer circuit 12B comprises a first slew-rate limiter circuit 50, a second slew-rate limiter circuit 52, and a differential amplifier 54. The first slew-rate limiter circuit 50 limits the slew-rate of the signal IN, and the second slew-rate limiter circuit 52 limits the slew-rate of the signal OB. The differential amplifier 54 differentially-amplifies the output signal Z1 of the first slew-rate limiter circuit 50 based on the output signal Z2 of the second slew-rate limiter circuit 52 and outputs the result as the output signal OUT.

Assuming that the first and second slew-rate limiter circuits 50 and 52 and differential amplifier 54 introduce no delay, the signal OUT, which rises approximately midway between the rising edge of the signal IN and the rising edge of the signal OB and falls approximately midway between the falling edge of the signal IN and the falling edge of the signal OB, is output from the output terminal of the differential amplifier 54. As shown in FIG. 6, however, the signal OUT is output from the output terminal of the differential amplifier 54 after the signal OUT is delayed by the first and second slew-rate limiter circuits 50 and 52, and the differential amplifier 54.

Figure 7:
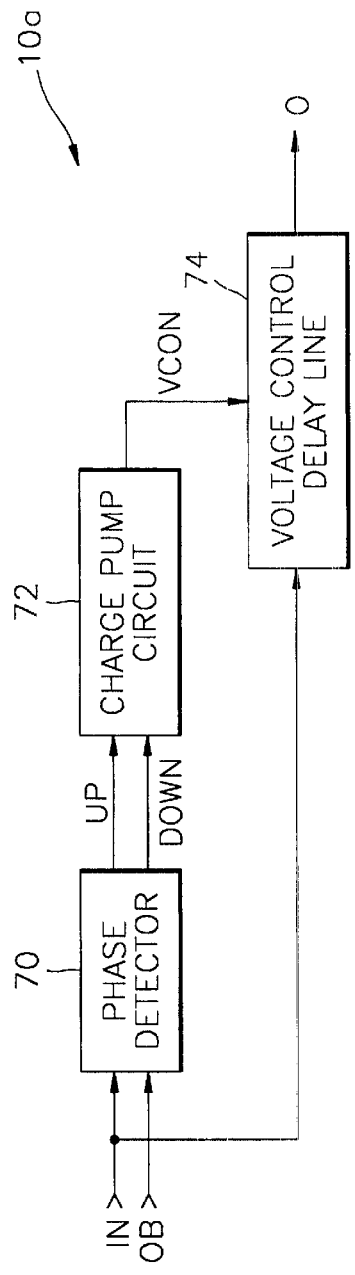
FIG. 7 is a block diagram that illustrates delay circuits in accordance with embodiments of the present invention.

FIG. 7 is a block diagram that illustrates delay circuits in accordance with embodiments of the present invention. In FIG. 7, the signal IN corresponds to the input signal IN shown in FIG. 1, the signal O corresponds to the signal O shown in FIG. 1, and the signal OB corresponds to the output signal OB of the inverting delay circuit 10 shown in FIG. 1.

Referring now to FIG. 7, the DLL circuit 10a comprises a phase detector circuit 70, a charge pump circuit 72, and a voltage controlled delay line 74. The phase detector circuit 70 compares the phase of the signal IN with the phase of the signal OB and generates output signals UP and DOWN responsive to the phase-comparative result. The charge pump circuit 72 varies the voltage level of a control signal VCON in response to the output signals UP and DOWN of the phase detector circuit 70. The voltage controlled delay line 74 generates the signal O by delaying the signal IN in response to the control signal VCON.

As discussed hereinabove with reference to FIG. 2, When the DLL circuit 10a is locked, the output signal O, which is delayed as much as time tLOW corresponding to the low level interval of the input signal IN, is continuously generated by the DLL circuit 10a. In other words, when the signal O, which is delayed as much as time tLOW corresponding to the low level interval of the input signal IN, is generated by the voltage controlled delay line 74, the rising edge of the signal IN and the rising edge of the signal OB occur at substantially the same time, as shown in FIG. 2.

In accordance with further embodiments of the present invention, when an inverted version of the signal IN and the output signal O of the voltage controlled delay line 74 are provided as inputs to the phase detector circuit 70, the output signal O is preferably generated by the voltage controlled delay line 74 with a delay as much as time tHIGH corresponding to the high level interval of the signal IN.

Although FIGS. 3, 5, and 7 illustrate exemplary embodiments of phase mixer circuits and DLL circuits, it will be understood that the present invention is not limited to such embodiments, but is intended to encompass any configuration capable of carrying out the operations described herein.

Figure 8:
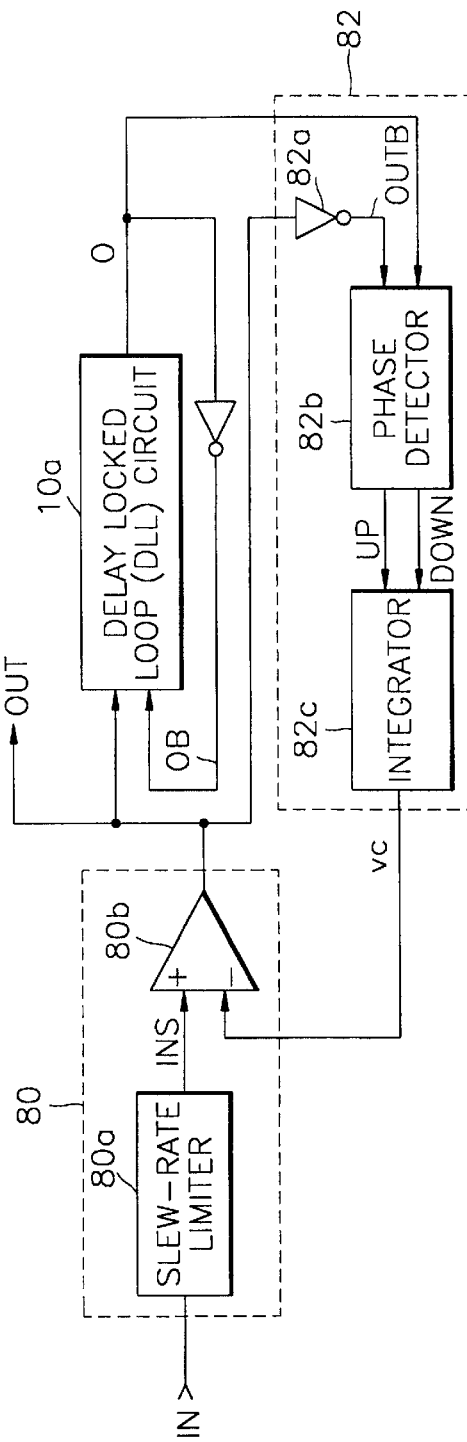
FIG. 8 is a block diagram that illustrates duty-cycle correction circuits in accordance with further embodiments of the present invention.

FIG. 8 is a block diagram that illustrates duty-cycle correction circuits in accordance with further embodiments of the present invention. Referring now to FIG. 8, an exemplary circuit for duty-cycle correction comprises a duty-cycle variable circuit 80, a delay circuit 10a, and a control circuit 82. The duty-cycle variable circuit 80 receives the input signal IN to generate a corrected output signal OUT and varies the duty cycle of the input signal IN in response to a control signal Vc. The duty-cycle variable circuit 80 comprises a slew-rate limiter circuit 80a and a differential amplifier 80b, which are configured as shown. The slew-rate limiter circuit 80a limits the slew-rate of the input signal IN and the differential amplifier 80b differentially-amplifies the output signal INS of the slew-rate limiter circuit 80a based on the control signal Vc and outputs the result as the signal OUT.

The delay circuit 10a, which has been discussed hereinabove with respect to FIGS. 1 and 7, outputs the signal O by delaying the output signal OUT of the duty-cycle variable circuit 80 for a predetermined time. In accordance with particular embodiments of the present invention, the delay circuit 10a may comprise a general delaying device or a DLL circuit. The delay circuit 10a preferably comprises a DLL circuit when the input signal IN has a high frequency.

The control circuit 82 controls the voltage level of the control signal Vc by comparing the phase of the output signal OUT of the duty-cycle variable circuit 80 with the phase of the output signal O of the delay circuit 10a and responding to the comparative result. In more detail, the control circuit 82 comprises an inverting circuit 82a, a phase detector circuit 82b, and an integrator 82c. In accordance with particular embodiments of the present invention, the integrator 82c may comprise a charge pump circuit or a low-pass filter (LPF) circuit. The inverting circuit 82a inverts the output signal OUT of the duty-cycle variable circuit 80. The phase detector 82b compares the phase of the output signal of the inverting circuit 82a with the phase of the output signal O of the delay circuit 10a. The integrator 82c varies the voltage level of the control signal Vc in response to the output signals UP and DOWN of the phase detector circuit 82b. The control circuit 82 varies the voltage level of the control signal Vc until the falling edge of the output signal OUT of the duty-cycle variable circuit 80 and the rising edge of the output signal O of the delay circuit 10a occur at substantially the same time.

In particular embodiments of the present invention in which the delay circuit 10a comprises a DLL circuit, the delay circuit 10a delays the output signal OUT of the duty-cycle variable circuit 80 in response to an inverted signal OB, which is an inverted version of the output signal O. That is, the delay circuit 10a delays the output signal OUT of the duty-cycle variable circuit 80 for a predetermined time by comparing the phase of the inverted signal OB with the phase of the output signal OUT and responding to the comparative result. The predetermined time may be an arbitrary time, but to more precisely correct the duty-cycle of the input signal IN, the predetermined time preferably corresponds to the low level or high level interval of the output signal OUT of the duty-cycle variable circuit 80.

Figure 9:
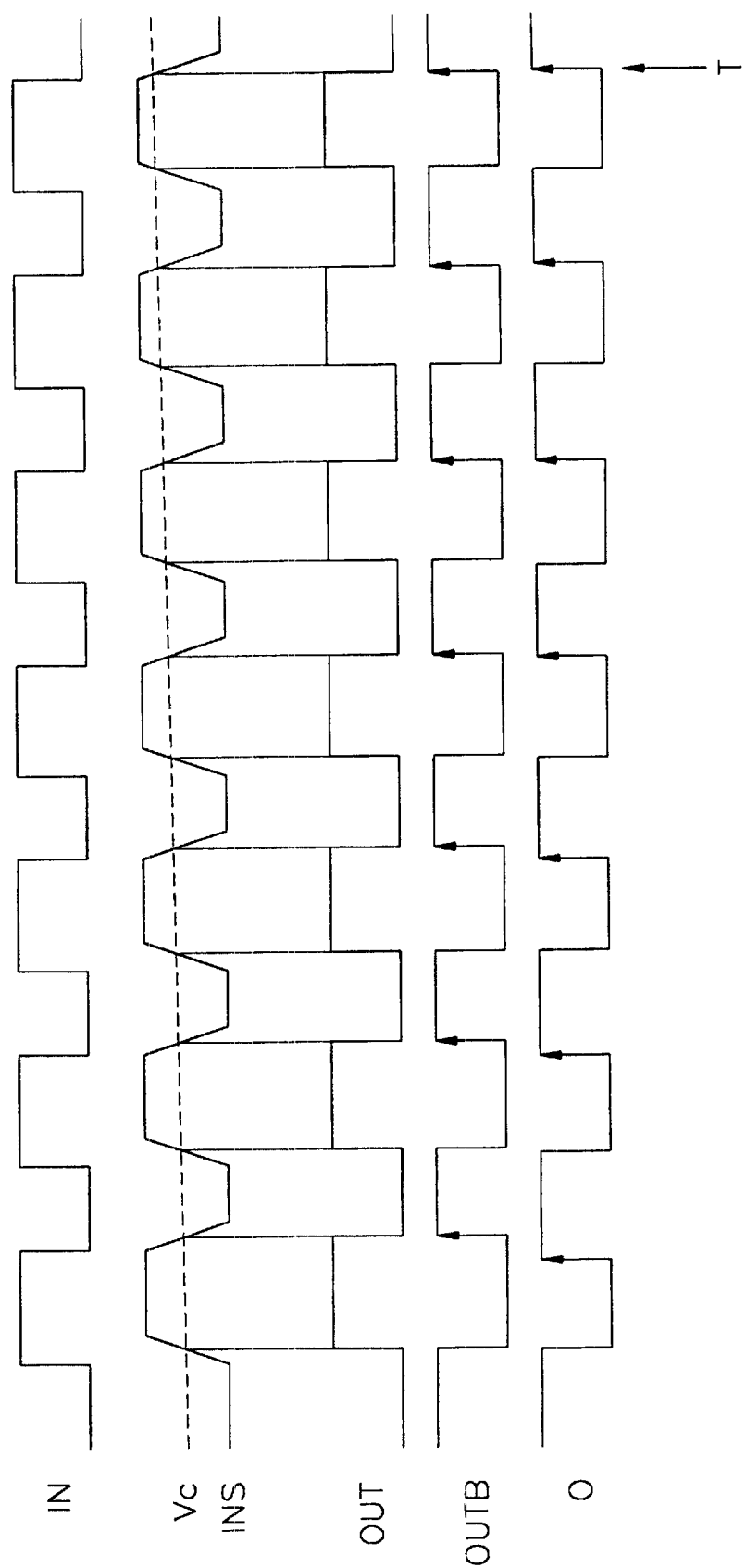
FIG. 9 is a signal timing diagram of signals that illustrate operations of duty-cycle correction circuits in accordance with further embodiments of the present invention.

FIG. 9 is a signal timing diagram of signals that illustrate operations of duty-cycle correction circuits in accordance with further embodiments of the present invention. The timing diagram shown in FIG. 9 is based on an exemplary embodiment in which the delay circuit 10a comprises a DLL circuit and the delay applied by the delay circuit 10a corresponds to the low level interval of the output signal OUT of the duty-cycle variable circuit 80.

When an input signal IN, which has a duty-cycle that is not equal to 50% is input to the duty-cycle variable circuit 80, the slew-rate limiter 80a limits the slew-rate of the input signal IN, and the differential amplifier 80b generates an output signal OUT by differentially-amplifying the output signal INS of the slew-rate limiter circuit 80 based on the control signal Vc.

When the output signal OUT of the duty-cycle variable circuit 80 is input to the DLL circuit, the DLL circuit compares the phase of the output signal OUT of the duty-cycle variable circuit 80 with the phase of the inverted signal OB, and variably-delays the output signal OUT of the duty-cycle variable circuit 80 responsive to the comparative result. In other words, the DLL circuit variably-delays the output signal OUT of the duty-cycle variable circuit 80 until the DLL circuit is locked, that is, until the rising edge of the output signal OUT and the falling edge of the output signal O occur at substantially the same time.

When the DLL circuit is locked, the output signal O, which is delayed as much as time tLOW corresponding to the low level interval of the output signal OUT, is continuously generated from the DLL circuit. The control circuit 82 controls the voltage level of the control signal Vc by comparing the phase of the output signal OUT of the duty-cycle variable circuit 80 with the phase of the output signal O of the DLL circuit and responding to the comparative result. In more detail, the control circuit 82 varies the voltage level of the control signal Vc until the falling edge of the output signal OUT of the duty-cycle variable circuit 80 (i.e., the rising edge of the output signal OUTB of the inverting circuit 82a) and the rising edge of the output signal O of the DLL circuit occur at substantially the same time.

When the falling edge of the output signal OUT of the duty-cycle variable circuit 80 (i.e., the rising edge of the output signal OUTB of the inverting circuit 82a) and the rising edge of the output signal O of the DLL circuit occur at substantially the same time, which is shown as time-point T in FIG. 9, the voltage level of the control signal Vc becomes substantially constant. As a result, from time point T onward, the duty cycle of the output signal OUT of the duty-cycle variable circuit 80 is at approximately 50%.

The relationship between the output signal OUT of the duty-cycle variable circuit 80 and the voltage level of the control signal Vc will be discussed hereafter. When the low level tLOW, OUT of the output signal OUT of the duty-cycle variable circuit 80 increases by δ due to a change in the voltage level of the control signal Vc, the high interval tHIGH, OUT and the low interval tLOW, OUT of the output signal OUT can be expressed by Equations 5 and 6, respectively, as follows:

$$tHIGH, OUT = tLOW, OUTB = tHIGH, IN - \delta \quad (5)$$

$$tLOW, OUT = tLOW, O = tLOW, IN + \delta \quad (6)$$

In Equations 5 and 6, tHIGH, IN and tLOW, IN represent the high level and low level intervals of the input signal IN, which is input to the duty-cycle variable circuit 80, respectively, tLOW, O represents the low level interval of the output signal O of the DLL circuit, and tLOW, OUTB represents the low level interval of the output signal OUTB of the inverting circuit 82a.

When the control circuit 82 adjusts the voltage level of the control signal Vc such that the falling edge of the output signal OUT of the duty-cycle variable circuit 80 (i.e., the rising edge of the output signal OUTB of the inverting circuit 82a) and the rising edge of the output signal O of the DLL circuit occur at substantially the same time, then the relationship between tHIGH, OUT, tLOW, OUTB, and tLOW, O may be expressed in accordance with Equation 7 as follows:

$$tHIGH, OUT = tLOW, OUTB = tLOW, O \quad (7)$$

Substituting Equations 5 and 6 into Equation 7 results in Equations 8 and 9 as follows:

$$tHIGH, IN - \delta = tLOW, IN + \delta \quad (8)$$

$$\delta = (tHIGH, IN - tLOW, IN)/2 \quad (9)$$

When Equation 9 is substituted for Equations 5 and 6, Equations 5 and 6 can be expressed as Equations 10 and 11 respectively:

$$tHIGH, OUT = tHIGH, IN - \delta = (tHIGH, IN = tLOW, IN)/2 = tCC/2 \quad (10)$$

$$tLOW, OUT = tLOW, IN + \delta = (tHIGH, IN + tLOW, IN)/2 = tCC/2 \quad (11)$$

In Equations 10 and 11, tCC represents the period of the input signal IN. Accordingly, the duty-cycle of the output signal OUT of the duty-cycle variable circuit 80 is approximately 50%.

Exemplary operations of duty-cycle correction circuits have been described by way of example in which the delay time of the DLL circuit corresponds to the low level interval tLOW of the output signal OUT of the duty-cycle variable circuit 80. It will be understood, however, that any delay time may be used, including a delay time that corresponds to the high level interval tHIGH of the output signal OUT of the duty-cycle variable circuit 80. Moreover, a compensating delaying device may be interposed between the inverting output terminal of the DLL circuit, from which the inverting output signal OB is output, and the input terminal of the DLL circuit, in accordance with further embodiments of the present invention.

A duty-cycle variable circuit 80, a delay circuit 10a, and a control circuit 82 for controlling the duty-cycle variable circuit 80 may be used in duty-cycle correction circuits in accordance with embodiments of the present invention illustrated in FIG. 8. Although embodiments of the present invention illustrated in FIG. 8 may comprise an integrator 82c, the offset of the integrator 82c may be reduced because the output signals UP and DOWN of the phase detector 82b, which are input to the integrator 82c, generally have a short pulse. Advantageously, duty-cycle correction circuits in accordance with embodiments of the present invention illustrated in FIG. 8 may reduce duty-cycle error and generate an output signal with a duty-cycle of approximately 50%.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. A method of correcting a duty-cycle of a signal, comprising:

delaying the signal for a predetermined time to generate a delayed version of the signal, wherein the predetermined time is selected from the group consisting of a time in which the signal is in a first state during a single cycle of the signal and a time in which the signal is in a second state during the single cycle of the signal; and generating an output signal that transitions from the first state to the second state responsive to a transition of the signal from the first state to the second state and a transition of the delayed version of the signal from the second state to the first state, and that transitions from the second state to the first state responsive to a transition of the signal from the second state to the first state and a transition of the delayed version of the signal from the first state to the second state.

2. The method of claim 1, wherein generating the output signal comprises:

inverting the delayed version of the signal to generate an inverted delayed version of the signal;

limiting a slew rate of the signal to generate a first intermediate output signal; and limiting a slew rate of the inverted delayed version of the signal to generate a second intermediate output signal.

3. The method of claim 2, wherein generating the output signal further comprises:

determining a voltage difference between the first and second intermediate output signals; and generating the output signal responsive to the voltage difference between the first and second intermediate output signals.

4. The method of claim 1, wherein delaying the signal to generate the delayed version of the signal comprises:

determining a phase difference between the signal and the delayed version of the signal;

generating a control voltage responsive to the phase difference between the signal and the delayed version of the signal; and delaying the signal to generate the delayed version of the signal responsive to the control voltage.

5. The method of claim 1, wherein the output signal transitions from the first state to the second state between the transition of the signal from the first state to the second state and the transition of the delayed version of the signal from the second state to the first state, and the output signal transitions from the second state to the first state between the transition of the signal from the second state to the first state and the transition of the delayed version of the signal from the first state to the second state.

6. A method of correcting a duty-cycle of a signal, comprising:

limiting a slew rate of the signal to generate a first intermediate output signal;

determining a voltage difference between the first intermediate output signal and a reference voltage;

generating an output signal responsive to the voltage difference between first intermediate output signal and the reference voltage;

delaying the output signal to generate a delayed version of the output signal; and generating the reference voltage responsive to the output signal and the delayed version of the output signal.

7. The method of claim 6, wherein delaying the output signal to generate the delayed version of the output signal comprises:

determining a phase difference between the output signal and the delayed version of the output signal;

generating a control voltage responsive to the phase difference between the output signal and the delayed version of the output signal; and delaying the output signal to generate the delayed version of the output signal responsive to the control voltage.

8. The method of claim 6, wherein generating the reference voltage comprises:

determining a phase difference between the output signal and the delayed version of the output signal; and generating the reference voltage responsive to the phase difference between the output signal and the delayed version of the output signal.

9. A duty-cycle correction circuit, comprising:

a delay circuit that is configured to generate a delayed signal for a predetermined period of time responsive to an input signal, wherein the predetermined time is selected from the group consisting of a time in which the signal is in a first state during a single cycle of the signal and a time in which the signal is in a second state during the single cycle of the signal; and a mixer circuit that is configured to generate an output signal that transitions from the first state to the second state responsive to a transition of the input signal from the first state to the second state and a transition of the delayed signal from the second state to the first state, and that transitions from the second state to the first state responsive to a transition of the input signal from the second state to the first state and a transition of the delayed signal from the first state to the second state.

10. The duty-cycle correction circuit of claim 9, further comprising:

a first inverter that is configured to generate an inverted delayed signal at an output terminal thereof responsive to the delayed signal.

11. The duty-cycle correction circuit of claim 10, wherein the mixer circuit comprises:

a second inverter that is configured to generate a first intermediate output signal at an output terminal thereof responsive to the input signal;

a third inverter that is configured to generate a second intermediate output signal at an output terminal thereof responsive to the inverted delayed signal; and a fourth inverter that is configured to generate the output signal responsive to the first and second intermediate output signals received at an input terminal thereof.

12. The duty-cycle correction circuit of claim 10, wherein the mixer circuit comprises:

a first slew-rate limiter circuit that is configured to generate a first intermediate output signal responsive to the input signal; and a second slew-rate limiter circuit that is configured to generate a second intermediate output signal responsive to the inverted delayed signal.

13. The duty-cycle correction circuit of claim 12, wherein the mixer circuit further comprises:

a differential amplifier circuit that is configured to generate the output signal responsive to the first and second intermediate output signals.

14. The duty-cycle correction circuit of claim 9, wherein the delay circuit comprises:

a phase detector circuit that is configured to determine a phase difference between the input signal and the delayed signal;

a control voltage generator circuit that is configured to generate a control voltage responsive to the phase difference between the input signal and the delayed signal; and a delay line circuit that is configured to generate the delayed signal responsive to the control voltage.

15. The duty-cycle correction circuit of claim 14, wherein the control voltage generator circuit comprises a charge pump circuit.

16. A duty-cycle correction circuit, comprising:

a differential amplifier circuit that is configured to generate an output signal responsive to an input signal and a reference voltage;

a delay circuit that is configured to generate a delayed signal responsive to the output signal; and a control circuit that is configured to generate the reference voltage responsive to the output signal and the delayed signal.

17. The duty-cycle correction circuit of claim 16, further comprising:

a slew-rate limiter circuit that is configured to generate a first intermediate output signal responsive to the input signal; and wherein the differential amplifier circuit is configured to generate the output signal responsive to the first intermediate output signal and the reference voltage.

18. The duty-cycle correction circuit of claim 16, wherein the delay circuit comprises:

a phase detector circuit that is configured to determine a phase difference between the output signal and the delayed signal;

a control voltage generator circuit that is configured to generate a control voltage responsive to the phase difference between the output signal and the delayed signal; and a delay line circuit that is configured to generate the delayed signal responsive to the control voltage.

19. The duty-cycle correction circuit of claim 18, wherein the control voltage generator circuit comprises a charge pump circuit.

20. The duty-cycle correction circuit of claim 16, wherein the control circuit comprises:

a phase detector that is configured to determine a phase difference between the output signal and the delayed signal; and an integrator circuit that is configured to generate the reference voltage responsive to the phase difference between the output signal and the delayed signal.

21. The duty-cycle correction circuit of claim 20, wherein the integrator circuit comprises a charge pump circuit.

22. The duty-cycle correction circuit of claim 21, wherein the integrator circuit comprises a low-pass filter circuit.

23. A duty-cycle correction circuit, comprising:

means for delaying a signal for a predetermined time to generate a delayed version of the signal, wherein the predetermined time is selected from the group consisting of a time in which the signal is in a first state during a single cycle of the signal and a time in which the signal is in a second state during the single cycle of the signal; and means for generating an output signal that transitions from the first state to the second state responsive to a transition of the signal from the first state to the second state and a transition of the delayed version of the signal from the second state to the first state, and that transitions from the second state to the first state responsive to a transition of the signal from the second state to the first state and a transition of the delayed version of the signal from the first state to the second state.

24. The duty-cycle correction circuit of claim 23, wherein the means for generating the output signal comprises:

means for inverting the delayed version of the signal to generate an inverted delayed version of the signal;

means for limiting a slew rate of the signal to generate a first intermediate output signal; and means for limiting a slew rate of the inverted delayed version of the signal to generate a second intermediate output signal.

25. The duty-cycle correction circuit of claim 24, wherein the means for generating the output signal further comprises:

means for determining a voltage difference between the first and second intermediate output signals; and means for generating the output signal responsive to the voltage difference between the first and second intermediate output signals.

26. The duty-cycle correction circuit of claim 23, wherein the means for delaying the signal to generate the delayed version of the signal comprises:

means for determining a phase difference between the signal and the delayed version of the signal;

means for generating a control voltage responsive to the phase difference between the signal and the delayed version of the signal; and means for delaying the signal to generate the delayed version of the signal responsive to the control voltage.

27. The duty-cycle correction circuit of claim 23, wherein the output signal transitions from the first state to the second state between the transition of the signal from the first state to the second state and the transition of the delayed version of the signal from the second state to the first state, and the output signal transitions from the second state to the first state between the transition of the signal from the second state to the first state and the transition of the delayed version of the signal from the first state to the second state.

28. A duty-cycle correction circuit, comprising:

means for limiting a slew rate of a signal to generate a first intermediate output signal;

means for determining a voltage difference between the first intermediate output signal and a reference voltage;

means for generating an output signal responsive to the voltage difference between first intermediate output signal and the reference voltage;

means for delaying the output signal to generate a delayed version of the output signal; and means for generating the reference voltage responsive to the output signal and the delayed version of the output signal.

29. The duty-cycle correction circuit of claim 28, wherein the means for delaying the output signal to generate the delayed version of the output signal comprises:

means for determining a phase difference between the output signal and the delayed version of the output signal;

means for generating a control voltage responsive to the phase difference between the output signal and the delayed version of the output signal; and means for delaying the output signal to generate the delayed version of the output signal responsive to the control voltage.

30. The duty-cycle correction circuit of claim 28, wherein the means for generating the reference voltage comprises:

means for determining a phase difference between the output signal and the delayed version of the output signal; and means for generating the reference voltage responsive to the phase difference between the output signal and the delayed version of the output signal.

* * * * *

UNITED STATES PATENT AND TRADEMARK OFFICE
CERTIFICATE OF CORRECTION

PATENT NO. : 6,466,071 B2
DATED : October 15, 2002
INVENTOR(S) : Kim et al.

It is certified that error appears in the above-identified patent and that said Letters Patent is hereby corrected as shown below:

<u>Title page,</u>
Item [56], OTHER PUBLICATIONS, the first reference should read as follows:
-- Thomas H. Lee et al.: A 2.5 V CMOS Delay-Locked Loop for an 18 Mbit, 500 Megabyte/s DRAM; IEEE Journal of Solid-State Circuits, vol. 29, No. 12; Dec. 1994; pp. 1491-1496. --

Signed and Sealed this

Eighteenth Day of March, 2003

JAMES E. ROGAN
*Director of the United States Patent and Trademark Office*